US012707925B2

(12) United States Patent
Yang

(10) Patent No.: US 12,707,925 B2
(45) Date of Patent: Aug. 11, 2026

(54) SUBSTRATE PROCESSING APPARATUS AND PROCESS CONTROL METHOD THEREOF

(71) Applicant: SEMES CO., LTD., Cheonan-si (KR)

(72) Inventor: Young Hwan Yang, Yongin-si (KR)

(73) Assignee: SEMES CO., LTD., Cheonan-si (KR)

( * ) Notice: Subject to any disclaimer, the term of this patent is extended or adjusted under 35 U.S.C. 154(b) by 593 days.

(21) Appl. No.: 17/990,644

(22) Filed: Nov. 18, 2022

(65) Prior Publication Data

US 2023/0163003 A1 May 25, 2023

(30) Foreign Application Priority Data

Nov. 19, 2021 (KR) ........................ 10-2021-0160418

(51) Int. Cl.

*H10P 72/00* (2026.01)
*G05B 19/418* (2006.01)
*H10P 72/30* (2026.01)
*H10P 72/76* (2026.01)

(52) U.S. Cl.

CPC ...... *H10P 72/0612* (2026.01); *G05B 19/4189* (2013.01); *H10P 72/0464* (2026.01); *H10P 72/3402* (2026.01); *H10P 72/3404* (2026.01); *H10P 72/7602* (2026.01); *G05B 2219/39001* (2013.01)

(58) Field of Classification Search

CPC ......... H01L 21/67276; H01L 21/67196; H01L 21/67766; H01L 21/67769; H01L 21/68707; H01L 21/67745; H01L 21/67167; H01L 21/67173; H01L 21/67742; G05B 19/4189; G05B 2219/39001; Y02P 90/02

See application file for complete search history.

(56) References Cited

U.S. PATENT DOCUMENTS 6,122,566 A * 9/2000 Nguyen ............ H01L 21/67276 700/218
10,043,693 B1 8/2018 Kim et al.
11,764,086 B2 9/2023 Trussell et al.

(Continued)

FOREIGN PATENT DOCUMENTS

KR 10-2007-0109298 11/2007
KR 10-2008-0072238 8/2008

(Continued)

OTHER PUBLICATIONS

Office Action from the China National Intellectual Property Administration dated Sep. 13, 2025.

*Primary Examiner* — Eric J Yoon

(57) ABSTRACT

A process control method of a substrate processing apparatus includes monitoring a process status of each process chamber of a plurality of process chambers, determining a shift-to-idle process chamber to be shifted from a process state to an idle state among the plurality of process chambers, storing a first to-be-processed substrate in a storage, associated with the shift-to-idle process chamber, among a plurality of storages provided in a transfer chamber, and transferring the first to-be-processed substrate stored in the storage to the shift-to-idle process chamber in accordance with a shift to the idle state of the shift-to-idle process chamber.

7 Claims, 14 Drawing Sheets

(56) References Cited

U.S. PATENT DOCUMENTS

2003/0009251 A1* 1/2003 Lin ........................ G06Q 10/06
700/97
2015/0162180 A1* 6/2015 Grau ................... H10P 72/3216
700/121
2020/0135500 A1* 4/2020 Chen ................. H01L 21/68721
2020/0135525 A1* 4/2020 Reuter .............. H01L 21/67389
2021/0005485 A1 1/2021 Daugherty et al.
2022/0344183 A1* 10/2022 Trussell ............ H01L 21/67161

FOREIGN PATENT DOCUMENTS

KR 10-2010-0045133 5/2010
KR 10-2017-0054242 5/2017
KR 10-2285969 1/2020

* cited by examiner 100
110
111
115
120
121
125
130
131a
131b
131c
131d
131e
131f
140
141
145
210
210c
210d
w1
w2

SUBSTRATE PROCESSING APPARATUS AND PROCESS CONTROL METHOD THEREOF

CROSS REFERENCE TO RELATED APPLICATION

The present application claims priority to Korean Patent Application No. 10-2021-0160418, filed Nov. 19, 2021, the entire contents of which is incorporated herein for all purposes by this reference.

BACKGROUND OF THE INVENTION

Field of the Invention

The present disclosure relates to a substrate processing apparatus and a process control method thereof and, more particularly, to a process control technology for substrate processing apparatus, which enables determining the process status of each of a plurality of process chambers provided in the substrate processing apparatus, to store a substrate to be processed after being put into each process chamber in a storage provided in a transfer chamber, and to transfer the substrate stored in the storage to the corresponding process chamber according to the process progress of the corresponding process chamber.

Description of the Related Art

In recent years, with the miniaturization and high integration of semiconductor devices, high precision and complexity of processes, and a larger wafer diameter are required. From the viewpoint of improving productivity (throughput) accompanying the increase in complex processes or single-wafer typification, a multi-chamber type substrate processing apparatus having a plurality of chambers to enable performing semiconductor device manufacturing processes in batch is attracting attention.

The multi-chamber type substrate processing apparatus includes a plurality of process chambers and at least one transfer chamber disposed between the respective process chambers to transfer a substrate to the process chamber. The substrate processing apparatus is divided into a cluster platform type and an inline platform type according to the arrangement of process chambers and transfer chambers.

When processing is performed using a multi-chamber type substrate processing apparatus, due to the complexity of the complex processes, the proportion of time required to transport substrates between chambers of the total manufacturing time of semiconductor devices is gradually increasing.

In this background, in order to improve substrate productivity, research on layouts of semiconductor manufacturing facilities that can reduce unnecessary transport and enable continuous processing is being actively conducted.

SUMMARY OF THE PRESENT DISCLOSURE

Accordingly, the present disclosure has been made keeping in mind the above problems occurring in the related art, and the present disclosure is intended to provide a substrate processing method that improves productivity by reducing the time required for substrate transfer in a multi-chamber substrate processing apparatus.

In particular, an objective of the present disclosure is to solve the problem of inefficiency that it takes a considerable amount of time to transfer substrates as a substrate to be processed is waiting in a load lock chamber while all of the plurality of chambers are in the process state, and when any one chamber finishes processing, the substrate is transferred to a transfer chamber and a transfer robot transfers the substrate to the corresponding chamber.

Moreover, an objective of the present disclosure is to solve the problem that, since the number of substrates that the transfer robot in the transfer chamber can transfer at a time and the number of substrates that can be transferred to the load lock chamber are limited, a delay occurs in substrate transfer with increasing number of process chambers, which limits process chamber extension.

The objectives of the present disclosure are not limited to the above, and other objectives and advantages of the present disclosure not mentioned may be understood by the following description.

In order to achieve the above objective, according to an embodiment of the present disclosure, a process control method of a substrate processing apparatus includes monitoring a process status of each process chamber of a plurality of process chambers, determining a shift-to-idle process chamber to be shifted from a process state to an idle state among the plurality of process chambers, storing a first to-be-processed substrate in a storage, associated with the shift-to-idle process chamber, among a plurality of storages provided in a transfer chamber, and transferring the first to-be-processed substrate stored in the storage to the shift-to-idle process chamber in accordance with a shift to the idle state of the shift-to-idle process chamber.

According to an embodiment of the present disclosure, the substrate processing apparatus may include: a plurality of process chambers configured to perform processing processes on a substrate; a transfer chamber provided with a storage disposed between the plurality of process chambers to temporarily store a to-be-processed substrate, and a transfer robot that transfers the substrate to the storage; and a control module configured to determine a process status for each of the plurality of process chambers and to manage storing and withdrawal of the to-be-processed substrate in/from the storage in correspondence with each of the process chambers.

According to an embodiment of the present disclosure, a process control method of a substrate processing apparatus may include: monitoring a process status to determine the process status for each of a plurality of process chambers, and to determine a shift-to-idle time for each of the plurality of process chambers by considering whether a to-be-processed substrate is stored in a storage provided in a transfer chamber in correspondence with each of the process chambers; determining an expected shift to determine a first shift-to-idle process chamber to be shifted to an idle state among the plurality of process chambers; storing a substrate to identify a storage corresponding to the shift-to-idle process chamber among the plurality of storages provided in the transfer chamber, and to transfer and store a to-be-processed substrate to the storage corresponding to the shift-to-idle process chamber; scheduling of substrate supply to establish a substrate supply plan for the shift-to-idle process chamber; and transferring a substrate to confirm the substrate supply plan for the shift-to-idle process chamber in accordance with a shift to the idle state of the shift-to-idle process chamber, and to transfer the to-be-processed substrate stored in the storage to the shift-to-idle process chamber.

According to the present disclosure, it is possible to improve productivity by reducing the time required for substrate transfer in a multi-chamber substrate processing apparatus.

In particular, according to the present disclosure, the time required to supply substrates can be significantly reduced since a substrate to be processed is stored in a storage adjacent to a corresponding process chamber in advance while all chambers are in the process state, and when the corresponding process chamber is shifted to the idle state, the substrate to be processed is immediately taken out of the storage and supplied to the corresponding process chamber.

Furthermore, in case of adding a process chamber to the substrate processing apparatus, by additionally disposing a storage corresponding thereto, it is possible to add process chambers without constraints related to a transfer robot of a transfer chamber.

The effects of the present disclosure are not limited to those mentioned above, and other effects not mentioned will be clearly understood by those skilled in the art from this specification and accompanying drawings.

BRIEF DESCRIPTION OF THE DRAWINGS

The above and other objectives, features, and other advantages of the present disclosure will be more clearly understood from the following detailed description when taken in conjunction with the accompanying drawings, in which:

FIGS. 8A to 8C are views illustrating an example of storing to-be-processed substrates in storages in the substrate processing apparatus according to the present disclosure;

FIGS. 10A and 10B are views illustrating an example of withdrawing the substrates stored in the storages and transferring them to process chambers in the substrate processing apparatus according to the present disclosure.

DETAILED DESCRIPTION OF THE PRESENT DISCLOSURE

Figure 1:
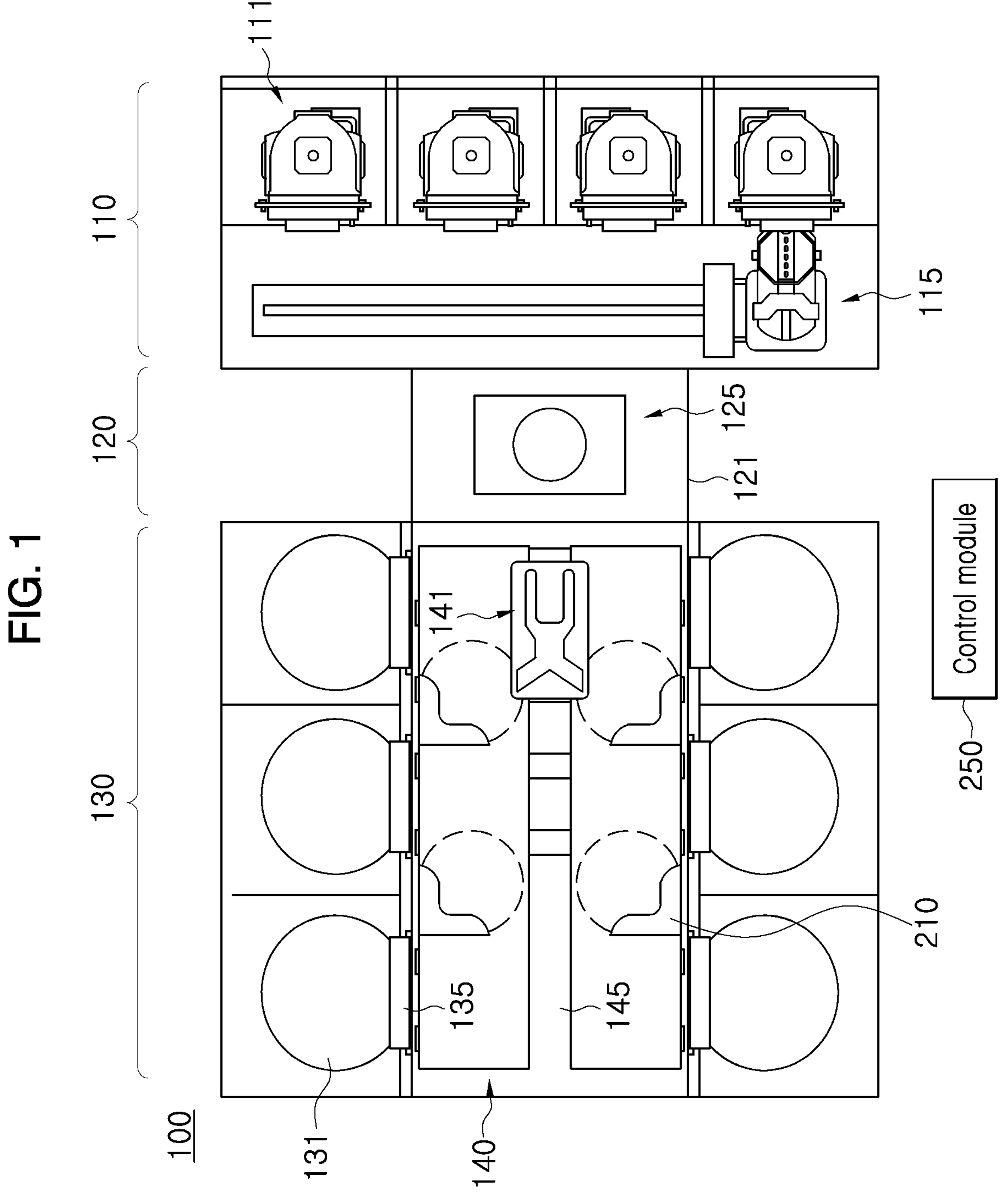
FIG. 1 is a view illustrating an embodiment of a substrate processing apparatus according to the present disclosure.

Hereinafter, embodiments of the present disclosure will be described in detail with reference to the accompanying drawings. However, the present disclosure is not limited by the embodiments.

In order to explain the present disclosure, the operational advantages of the present disclosure, and the objectives achieved by the practice of the present disclosure, the embodiments of the present disclosure are exemplified below and will be described with reference to them.

First, the terms used in this application are only used to describe specific embodiments, and are not intended to limit the present disclosure, and a singular expression may include a plural expression unless the context clearly indicates otherwise. In addition, it should be understood that in the present disclosure, terms such as "comprise" or "have" are intended to designate that a feature, number, step, operation, component, part, or combination thereof described in the specification exists, and do not preclude the possibility of addition or existence of one or more other features or numbers, steps, operations, components, parts, or combinations thereof.

In describing the present disclosure, when it is determined that a detailed description of a related known configuration or function may obscure the gist of the present disclosure, the detailed description thereof will be omitted.

A substrate processing apparatus of the present disclosure may include an index module 110, a load lock chamber module 120, and a process module 130.

The index module 110 may include a load port 111 and an index frame 115. The load port 111 may be disposed in front of the index frame 115, and a plurality of load ports may be arranged in a line. A carrier on which a plurality of substrates are mounted may be seated on the load port 111 during processing. The index frame 115 is interposed between the load port 111 and a load lock chamber 121, and may include a transfer robot for transferring substrates therein and transfer the substrates between the carrier and the load lock chamber 121. The index frame 115 may be provided as an equipment front end module (EFEM).

The load lock chamber 121 is positioned between the index module 110 and a transfer chamber 140 of the process module 130, and may be provided in a plurality or a multi-layer structure according to circumstances.

The load lock chamber 121 may maintain the process environment of the transfer chamber 140 and the process chamber 131 since the inner space 125 of the load lock chamber 121 is maintained in the same manner as the process environment.

The process module 130 may include the transfer chamber 140 and the plurality of process chambers 131. The process chambers 131 may be provided in a plurality of multi-chamber type.

The process chamber 131 may be disposed on each side of the transfer chamber 140 to receive substrates from the transfer chamber 140 to perform processes, and provide the processed substrates back to the transfer chamber 140.

The transfer chamber 140 may be positioned between the plurality of process chambers 131, and although in the present embodiment, the transfer chamber 140 and the process chamber 131 are described in an inline form, but the present disclosure is not limited thereto and the present disclosure may be applied to a cluster form.

The transfer chamber 140 is provided between the plurality of process chambers 131 to transfer a to-be-processed substrate to each process chamber 131 or to withdraw a processed substrate from each process chamber 131.

In the present embodiment, it is described that one transfer chamber 140 is provided, but depending on circumstances, a plurality of transfer chambers 140 may be arranged in series.

A transfer robot 141 and a storage 210 may be provided in the transfer chamber 140.

The transfer robot 141 may transfer and provide substrates to the plurality of process chambers 131 arranged in an inline form.

When one transfer robot 141 is provided in the transfer chamber 140, the transfer robot 141 moves on a moving frame 145 and transfers the substrates to each of the process chambers 131 provided on both sides of the transfer chamber 140.

A to-be-processed substrate may be stored in the storage 210 provided in the transfer chamber 140.

A plurality of storages 210 may be disposed in the transfer chamber 140 to correspond to each of the plurality of process chambers 131, or may be disposed in the transfer chamber 140 to correspond to several process chambers 131. For example, one storage 210 may be disposed between the two process chambers 131.

The storage 210 may be disposed near a door 135 of the corresponding process chamber 131, and when the corresponding process chamber 131 is operating, the storage 210 may temporarily store a to-be-processed substrate.

A control module 250 may determine a process status for each of the plurality of process chambers 131, control the transfer robot 141 to store the to-be-processed substrate in the storage 210 in accordance with the process chamber 131 that is operating, and control the transfer robot 141 to take out the to-be-processed substrate stored in the storage 210 and transfer it to the corresponding process chamber 131 when the corresponding process chamber 131 shifts to an idle state.

Figure 2:
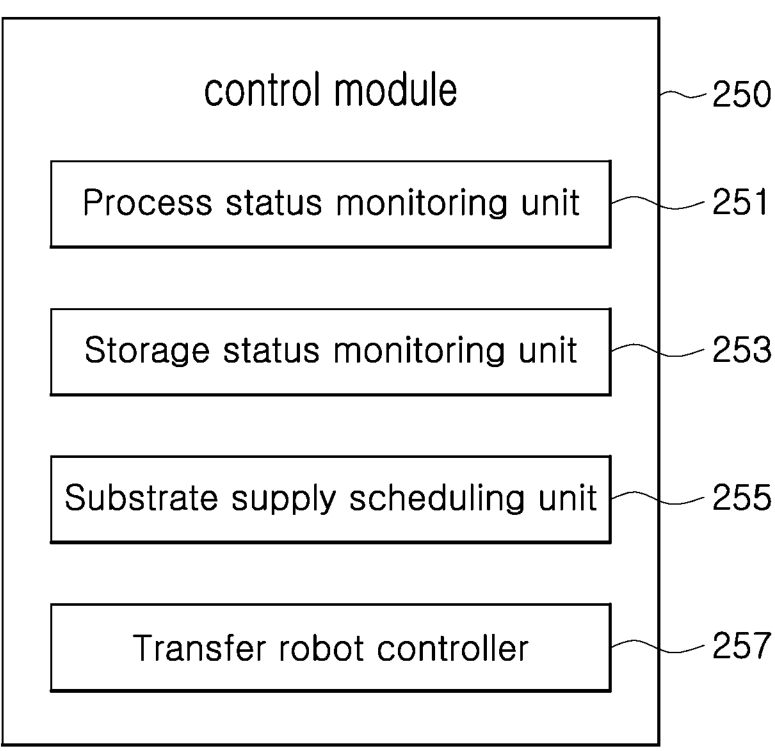
FIG. 2 is a block diagram of an example of a control module of the substrate processing apparatus according to the present disclosure.

Regarding the control module 250, it will be described in more detail with reference to the configuration diagram of an embodiment of the control module of the substrate processing apparatus according to the present disclosure shown in FIG. 2.

The control module 250 may include a process status monitoring unit 251, a storage status monitoring unit 253, a substrate supply scheduling unit 255, and a transfer robot controller 257.

The process status monitoring unit 251 may determine the process status of each of the plurality of process chambers 131. For example, the process status monitoring unit 251 may determine the process status while monitoring the process conditions of each process chamber 131 in real time, such as whether the process chamber 131 is in a process state in which a process is being carried out according to a related process recipe or in an idle state in which no process is being carried out, the remaining time until the end of the process treatment, and when to shift to an idle state.

The storage status monitoring unit 253 may determine whether a to-be-processed substrate is being stored in the storage 210 corresponding to the process chamber 131. The storage status monitoring unit 253 may determine and manage the storage status of the to-be-processed substrates in the plurality of storages 210 to correspond to each of the plurality of process chambers 131.

The substrate supply scheduling unit 255 may allocate a to-be-processed substrate to the process chamber 131 on the basis of the process status grasped by the process status monitoring unit 251.

When there is a spare process chamber in the idle state, the substrate supply scheduling unit 255 may allocate a to-be-processed substrate to the corresponding process chamber and transfer the substrate to the corresponding process chamber. When all process chambers are in the process state without any spare process chambers in idle state, the substrate supply scheduling unit 255 may store the to-be-processed substrate in the storage 210.

A to-be-processed substrate may be stored in the storage 210 to correspond to each process chamber 131 on the basis of the process status of each process chamber 131 grasped by the process status monitoring unit 251.

The substrate supply scheduling unit 255 may withdraw a to-be-processed substrate from the storage 210 and provide it to the corresponding process chamber 131 on the basis of the process status of each process chamber 131 grasped by the process status monitoring unit 251.

The substrate supply scheduling unit 255 may select the storage 210 to store the to-be-processed substrate on the basis of the process status of each of the plurality of process chambers 131 and the storage status of the to-be-processed substrates stored in the plurality of storages 210.

Furthermore, the substrate supply scheduling unit 255 may establish a substrate supply plan for each process chamber 131 by comprehensively considering the process status information of the process status monitoring unit 251 and the storage status information of the storage status monitoring unit 253.

Due to the control module 250, when the process chamber 131 is in the process state, the substrate to be processed next may be stored in the storage 210 near the process chamber 131 in advance, and when the corresponding process chamber 131 shifts to the idle state, the to-be-processed substrate may be immediately withdrawn from the storage 210 and supplied to the corresponding process chamber 131.

In the present disclosure, substrate supply delay time may be reduced by placing storages for temporary storing of to-be-processed substrates in the transfer chamber. The storages disposed in the transfer chamber will be looked at through embodiments.

Figure 3:
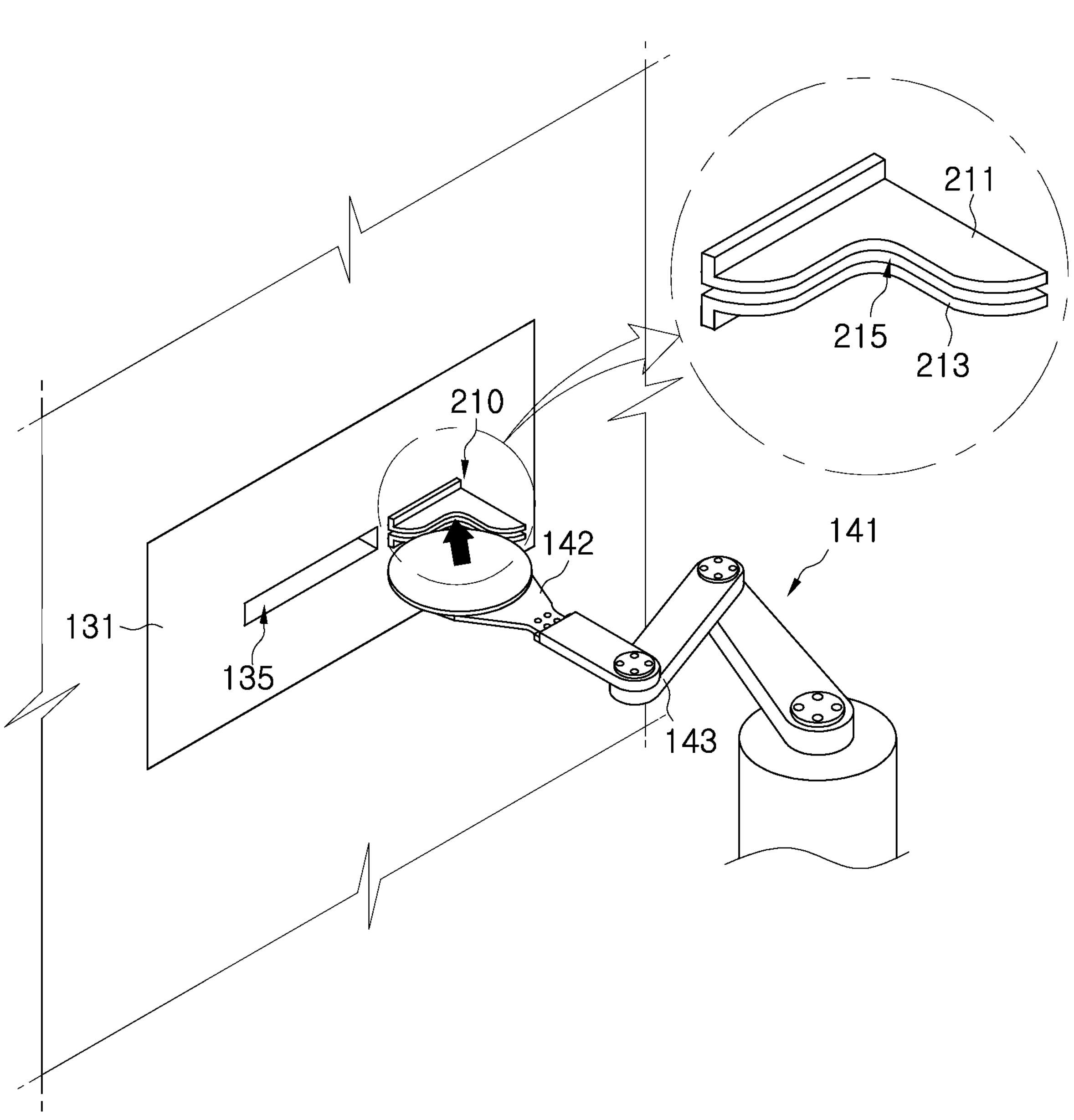
FIGS. 3, 4A, and 4B are views illustrating an example of a storage provided in a transfer chamber in the substrate processing apparatus according to the present disclosure.
Figure 4A:
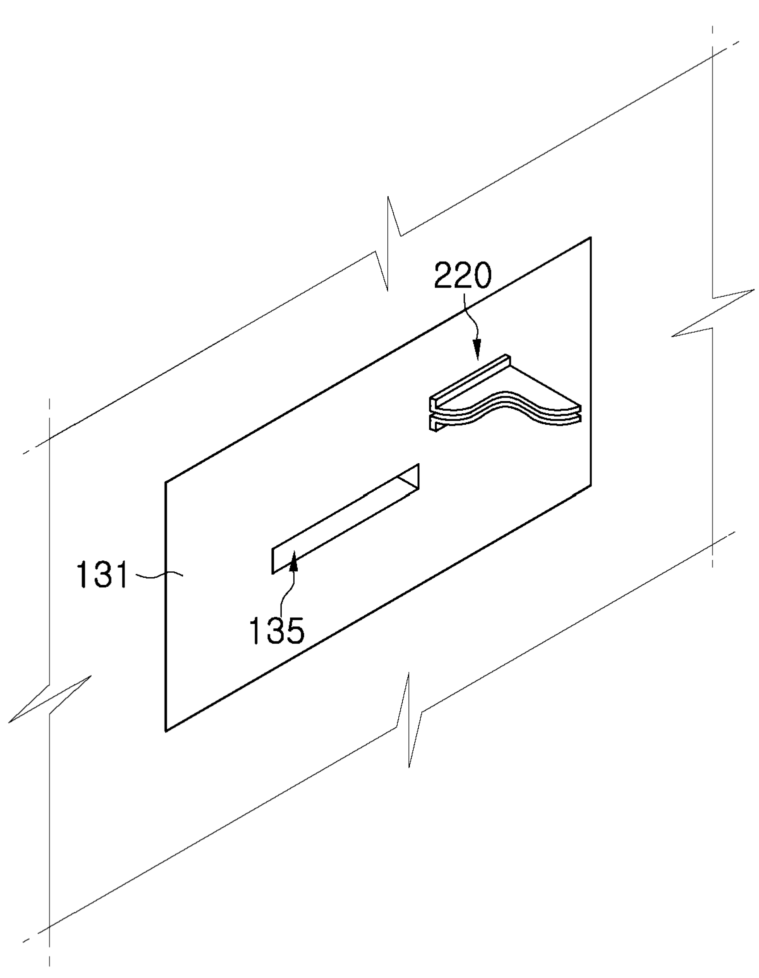
Figure 4B:
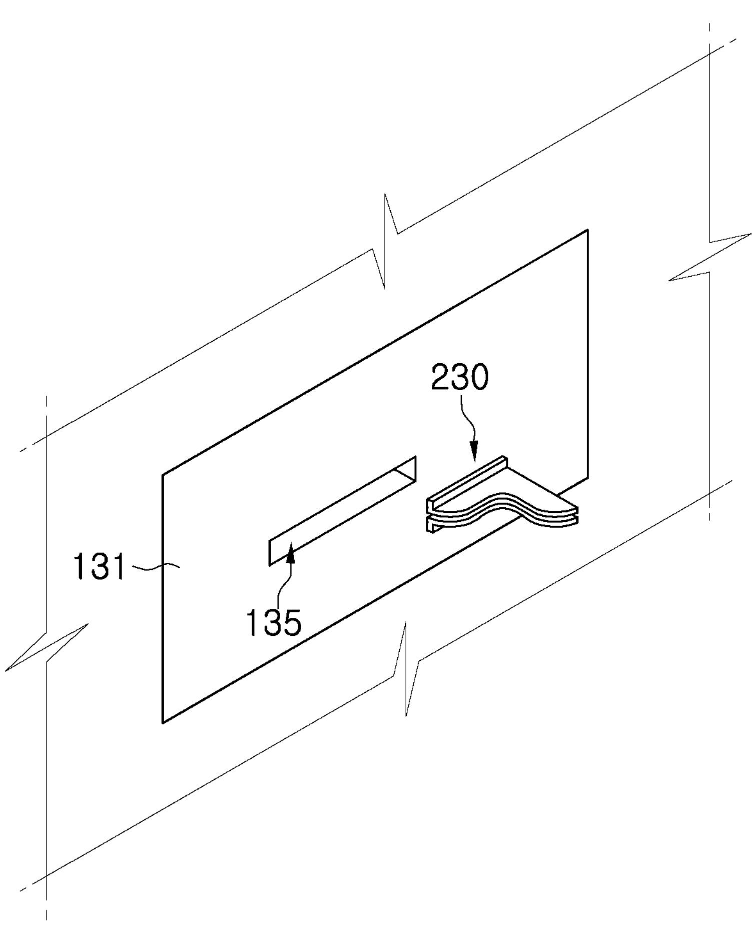

FIGS. 3, 4A, and 4B are views illustrating an example of a storage provided in a transfer chamber in the substrate processing apparatus according to the present disclosure.

The storage 210 may be disposed in the transfer chamber to correspond to each process chamber 131. One storage 210 may be disposed to correspond to one process chamber 131, or one storage 210 may be disposed to correspond to two or several process chambers 131.

The storage 210 may be disposed on a side wall near the door 135 of the corresponding process chamber 131.

The storage 210 may have an end mounted on the side wall near the door 135 of the process chamber 131, include an upper support 211 and a lower support 213 protruding outward from the sidewall, and be provided with a substrate storage space 215 between the upper support 211 and the lower support 213.

The upper support 211 and the lower support 213 may be variously deformed to correspond to the size of the stored substrate and the shape of the transfer robot 141.

For example, the transfer robot 141 may include an articulated robot arm 143 and a substrate support 142 as an end effector on which a substrate is seated on the end of the robot arm 143, and the upper support 211 and the lower support 213 may be modified in consideration of the shape of the substrate support 142 and the robot arm 143. Middle portions of the upper support 211 and the lower support 213 may have a shape recessed inward so that the substrate may be stably seated on the substrate storage space 215 in a state in which the substrate support 142 is partially inserted or not inserted into the substrate storage space 215.

The storage 210 may be disposed on a nearby sidewall on the same height as the door 135 of the process chamber 131. For example, the storage 210 may be disposed at a position that does not interfere with substrate transfer.

For example, as shown in FIG. 4A, the storage 210 may be disposed on a nearby sidewall at a position higher than the door 135 of the process chamber 131, or as shown in FIG. 4B, the storage 210 may be disposed on a nearby sidewall at a position lower than the door 135 of the process chamber 131.

The storage 220 may be deformed into various shapes and positions in which the substrate is stably seated and stored while the transfer robot 141 is not disturbed in the process of transferring the substrate.

Figure 5:
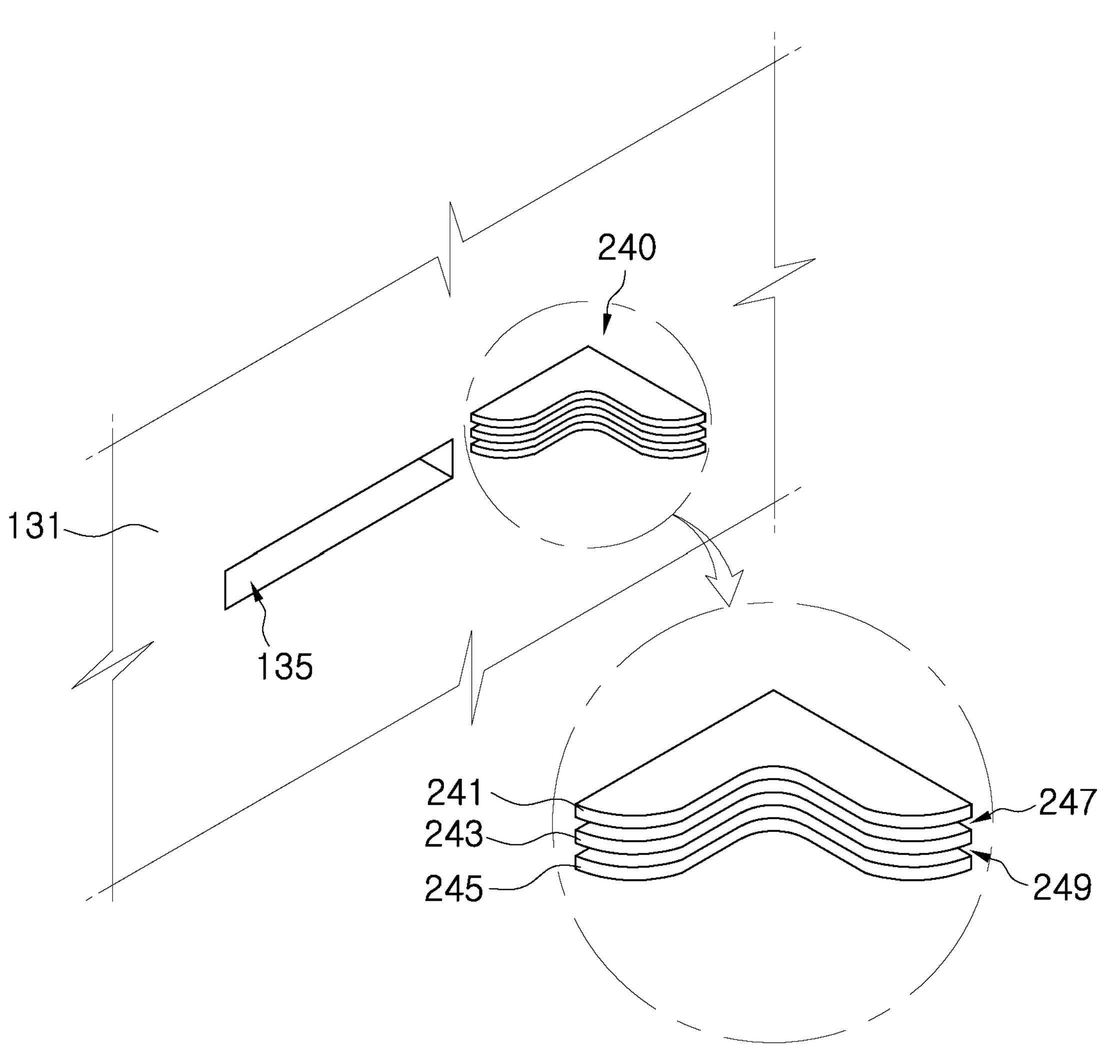
FIG. 5 is a view illustrating another example of the storage provided in the transfer chamber in the substrate processing apparatus according to the present disclosure.

A plurality of substrates may be stored in one storage. In this regard, FIG. 5 shows another example of the storage provided in the transfer chamber in the substrate processing apparatus according to the present disclosure.

The storage 240 may include an intermediate support 243 interposed between the upper support 241 and the lower support 245. A space between the upper support 241 and the lower support 245 may be partitioned by the intermediate support 243 to provide a plurality of substrate storage spaces 247 and 249.

The number of substrate storage spaces that can store substrates may be changed by changing the separation distance between the upper support 241 and the lower support 245 and the number of intermediate supports 243 disposed therebetween.

As described above, as the storage 240 may store a plurality of substrates, the substrate to be processed in the corresponding process chamber 131 may be stored in plurality in sequential order.

In addition, the present disclosure proposes a process control method applied to the substrate processing apparatus according to the present disclosure as described above. Hereinafter, the process control method of the substrate processing apparatus according to the present disclosure will be described. Since the process control method according to the present disclosure is implemented in the above-described substrate processing apparatus according to the present disclosure, the embodiment of the substrate processing apparatus according to the present disclosure will be referred to together.

Figure 6:
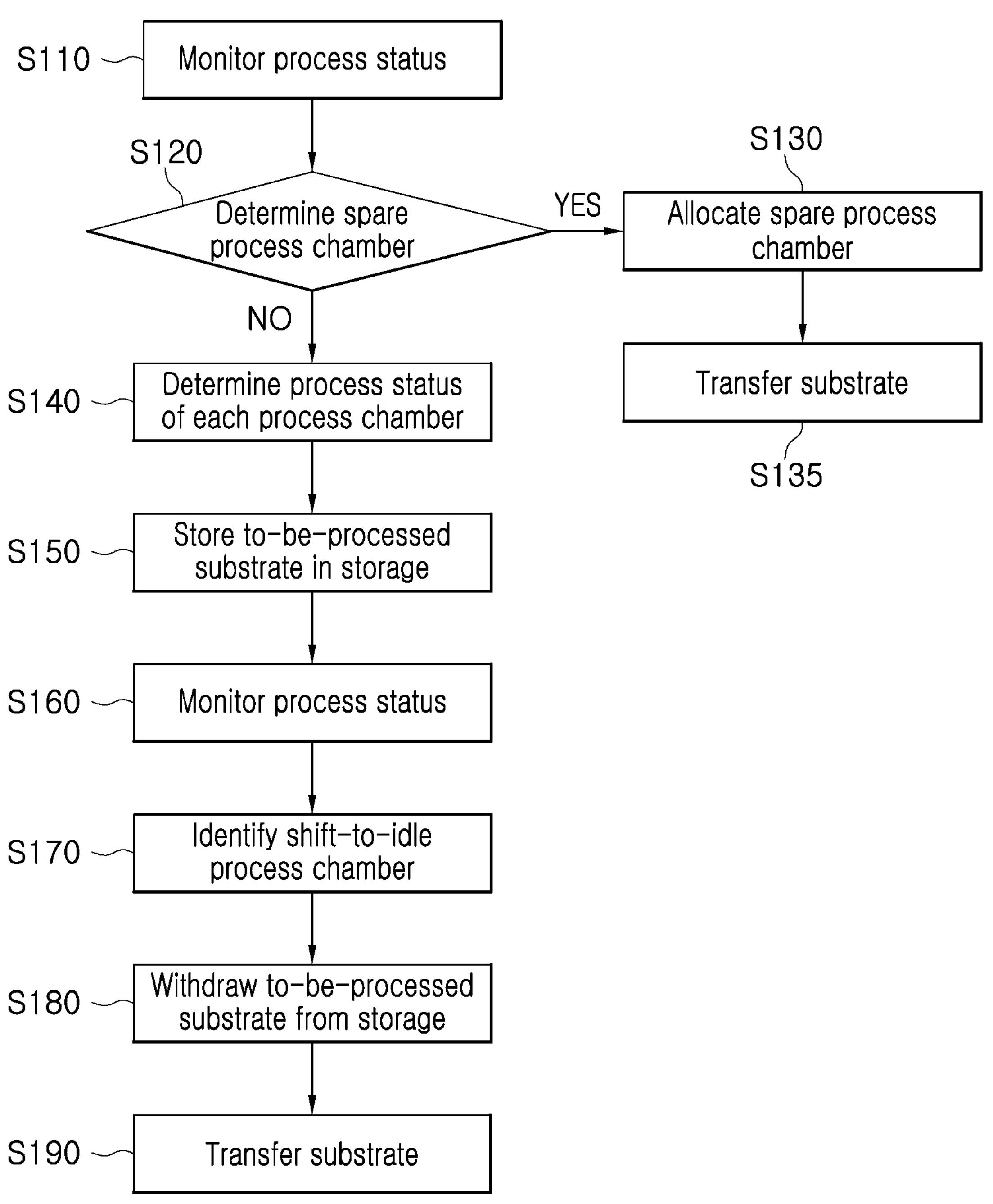
FIG. 6 is a flowchart illustrating an example of a process control method of the substrate processing apparatus according to the present disclosure.

FIG. 6 is a flowchart illustrating an example of a process control method of the substrate processing apparatus according to the present disclosure.

The control module 250 may determine (S110) the process status of each of the process chambers 131 while monitoring the process status of the plurality of process chambers 131.

For example, the control module 250 may determine the process status while monitoring the process conditions of each process chamber 131 in real time, such as whether each process chamber 131 is in the process state or in an idle state, the remaining time until the end of the process treatment, and when to shift to an idle state.

When the to-be-processed substrate is provided, the control module 250 may determine (S120) whether there is a spare process chamber in the idle state on the basis of the process status, and when there is a spare process chamber in the idle state, may allocate (S130) a to-be-processed substrate to the corresponding process chamber, and may control the transfer robot 141 of the transfer chamber 140 to transfer (S135) the to-be-processed substrate to the corresponding process chamber.

When the plurality of process chambers 131 are all in the process state, the control module 250 may identify the process chamber to be shifted to the idle state by determining (S140) the process status of each process chamber.

Then, the control module 250 may transfer and store (S150) a to-be-processed substrate to the storage 210 provided in the transfer chamber 140 to correspond to the process chamber.

Afterwards, while continuously monitoring (S160) the process status of the process chamber, the control module 250 may identify (S170) a shift to the idle state of the process chamber corresponding to the to-be-processed substrate stored in the storage 210.

When the corresponding process chamber shifts to the idle state, the control module 250 may withdraw (S180) the to-be-processed substrate stored in the storage 210 and transfer (S190) it to the corresponding process chamber.

As such, in the present disclosure, the substrate supply delay may be minimized by temporarily storing the to-be-processed substrate near the process chamber and supplying the stored substrate immediately when the process chamber shifts to the idle state.

The process control method of the substrate processing apparatus according to the present disclosure will be described in more detail by dividing a substrate storage process and a substrate supply process.

Figure 7:
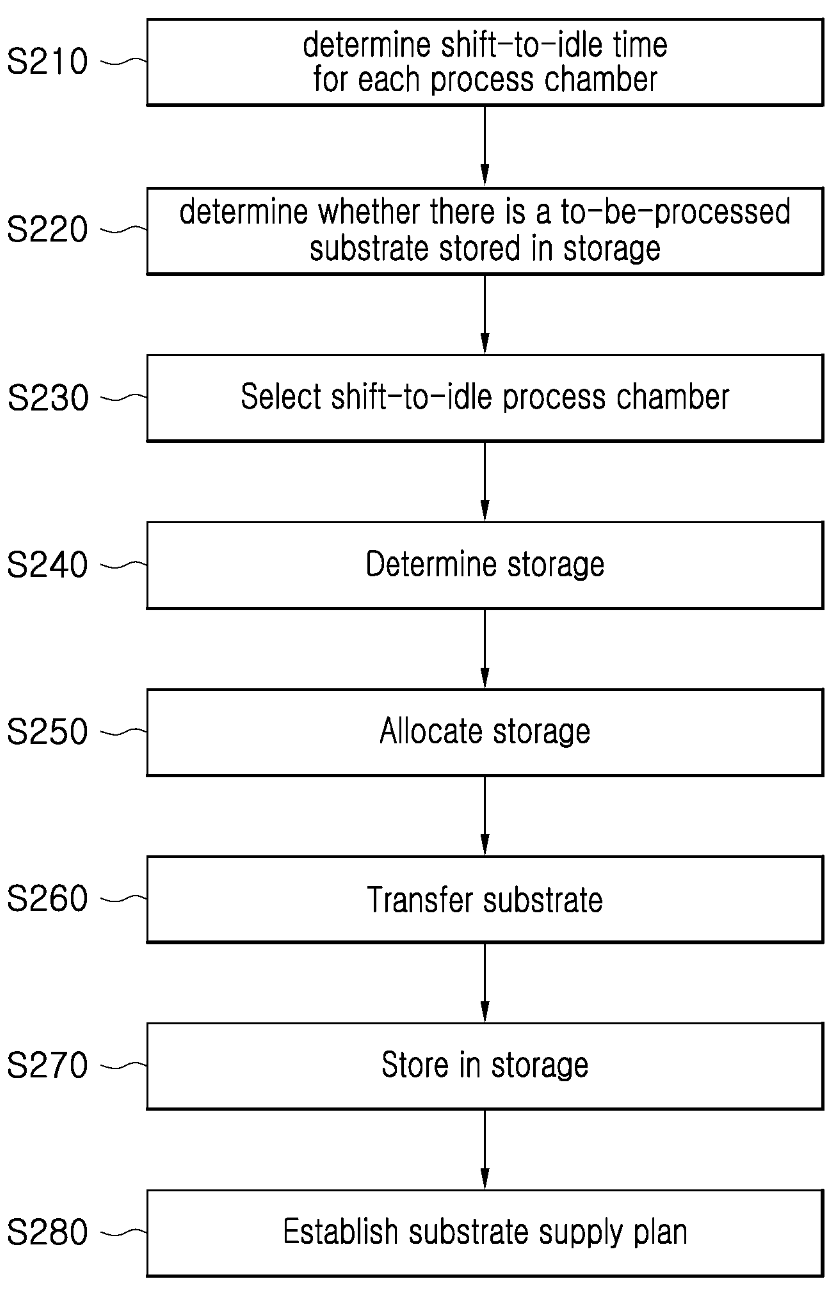
FIG. 7 is a flowchart illustrating an example of a process of storing a to-be-processed substrate in the storage in the process control method of the substrate processing apparatus according to the present disclosure.

Regarding the substrate storage process, FIG. 7 is a flowchart illustrating an example of a process of storing a to-be-processed substrate in the storage in the process control method of the substrate processing apparatus according to the present disclosure.

The control module 250 may determine (S210) a shift-to-idle time for each process chamber while collecting the process status of each of the plurality of process chambers.

For example, the control module 250 may determine a shift-to-idle process chamber to be shifted to the idle state first among the plurality of process chambers.

In addition, the control module 250 may determine (S220) whether there is a to-be-processed substrate stored in the storage 210 corresponding to each process chamber.

The control module 250 may determine the shift-to-idle time for the plurality of process chambers in consideration of whether the to-be-processed substrate is stored in the storage 210.

The control module 250 may select (S230) the shift-to-idle process chamber to be shifted to the idle state first in consideration of whether the to-be-processed substrate is stored.

When the shift-to-idle process chamber is selected, the control module 250 may determine (S240) a storage 210 corresponding to the selected process chamber, and allocate (S250) a to-be-processed substrate to that storage 210.

As the storage 210 is allocated, the control module 250 may control the transfer robot 141 of the transfer chamber 140 and transfer (S260) and store (S270) the to-be-processed substrate to that storage 210.

When a to-be-processed substrate is allocated and stored in all of the plurality of process chambers, or a process chamber that shifts to the idle state before a process chamber to which a to-be-processed substrate is not allocated is identified even when a to-be-processed substrate is already allocated, the control module 250 may store a plurality of to-be-processed substrates in a sequential order in the storage 210 according to the order in which the substrates are to be processed in correspondence with the corresponding process chamber.

In addition, the control module 250 may store the to-be-processed substrate in the storage 210 in correspondence with the corresponding process chamber, and then establish (S280) a substrate supply plan for the corresponding process chamber.

For example, the control module 250 may schedule the supply of the substrate to the process chamber by comprehensively considering, for each process chamber, the time remaining until the end of the process currently being performed, the existence and number of allocated to-be-processed substrates, the sequential order of to-be-processed substrates, and the estimated time required to process to-be-processed substrates, etc. In an embodiment, the control module 250 may change the established substrate supply plan by identifying the real-time process status of the process chamber.

Figure 8A:
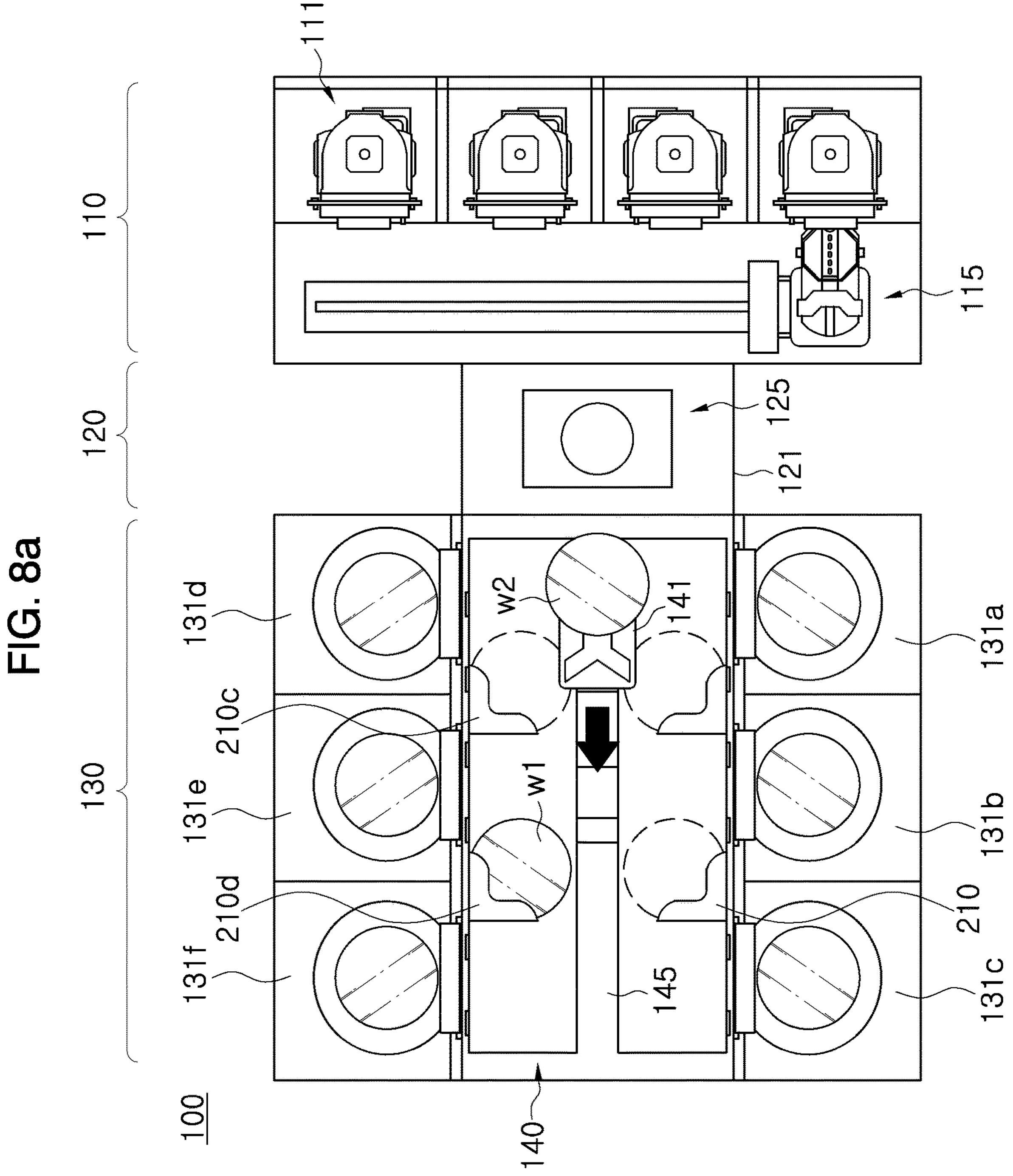
Figure 8B:
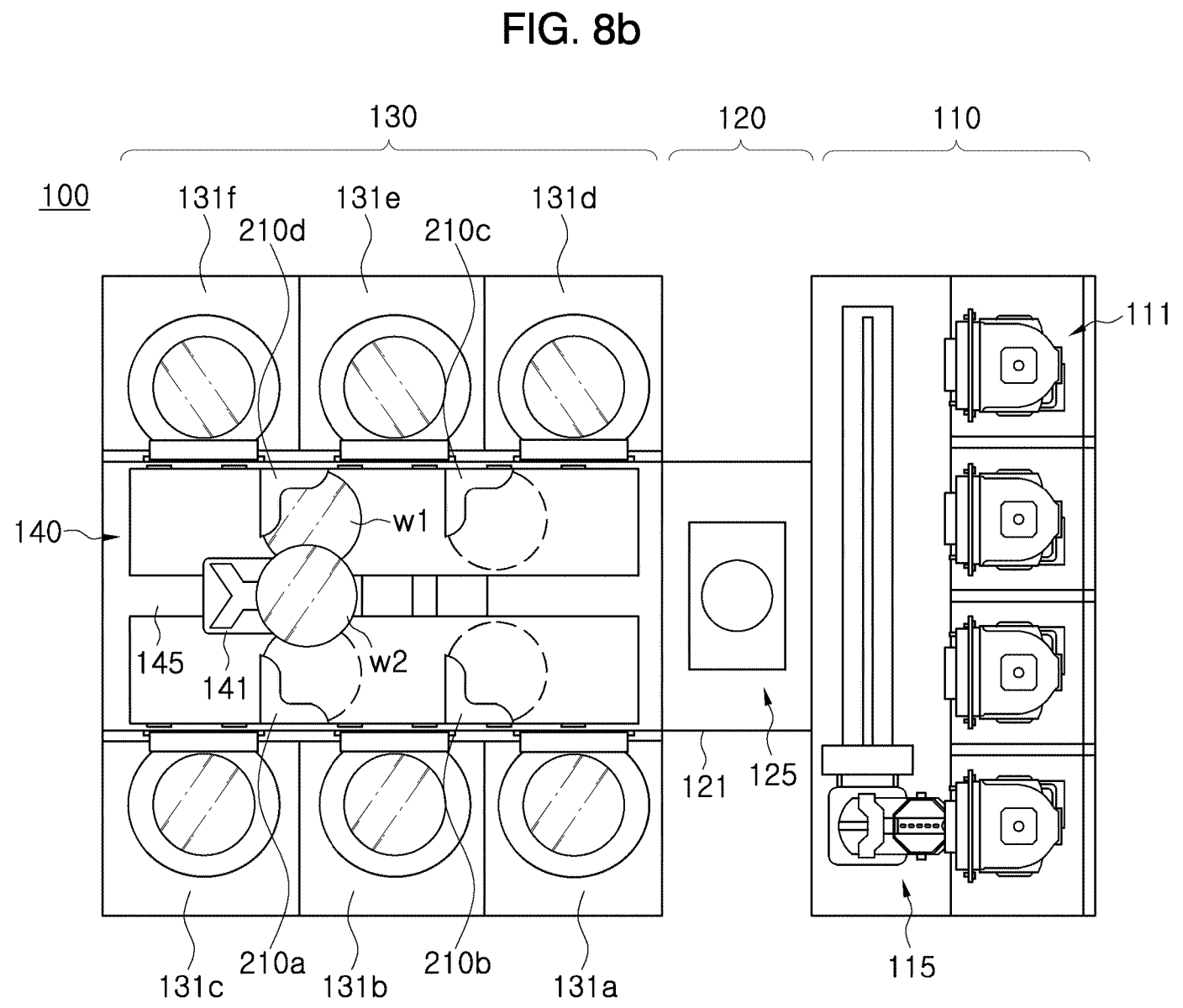
Figure 8C:
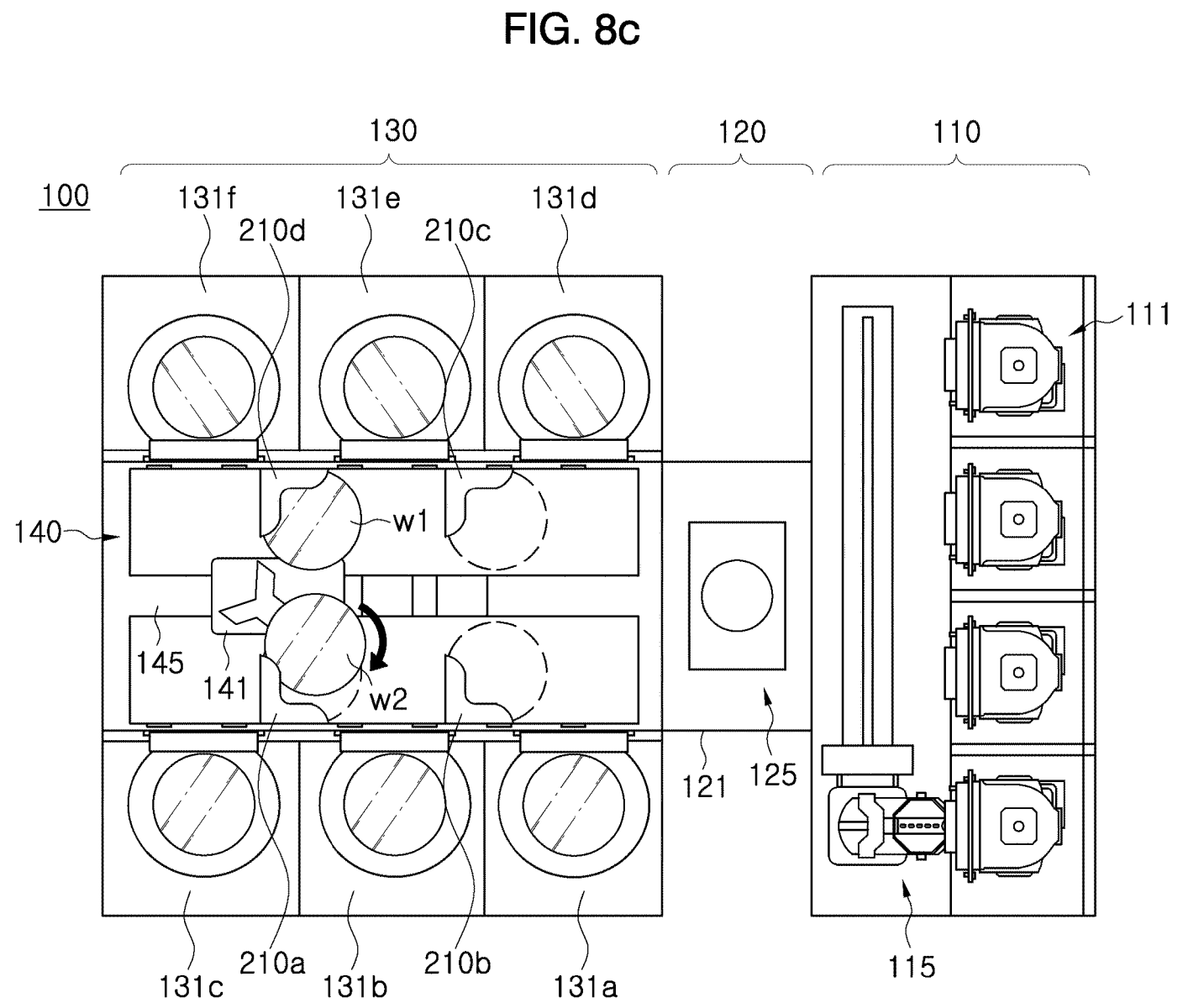

FIGS. 8A to 8C are views illustrating an example of storing to-be-processed substrates in storages in the substrate processing apparatus according to the present disclosure.

As shown in 8A, when all of the process chambers 131*a* to 131*f* are in the process state, the to-be-processed substrate waits in the load lock chamber 121 and is transferred as one of the process chambers 131*a* to 131*f* shifts to the idle stat. In this case, as the transfer robot 141 repeatedly moves in the transfer chamber 140 for each of the process chambers 131*a* to 131*f*, the delay time for supplying the substrate increases.

Therefore, in the present disclosure, the process chamber shifts to the idle state is identified by considering the process status of the process chambers 131*a* to 131*f* and a to-be-processed substrate w1 stored in the storage 210*d* together.

When the process chamber 131*b* to be shifted to the idle state first is identified, the transfer robot 141 moves a to-be-processed substrate w2 to the storage 210*a* corresponding to the process chamber 131*b* as shown in 8B to store the to-be-processed substrate w2 in the storage 210*a* in correspondence with the process chamber 131*b* as shown in 8C.

Figure 9:
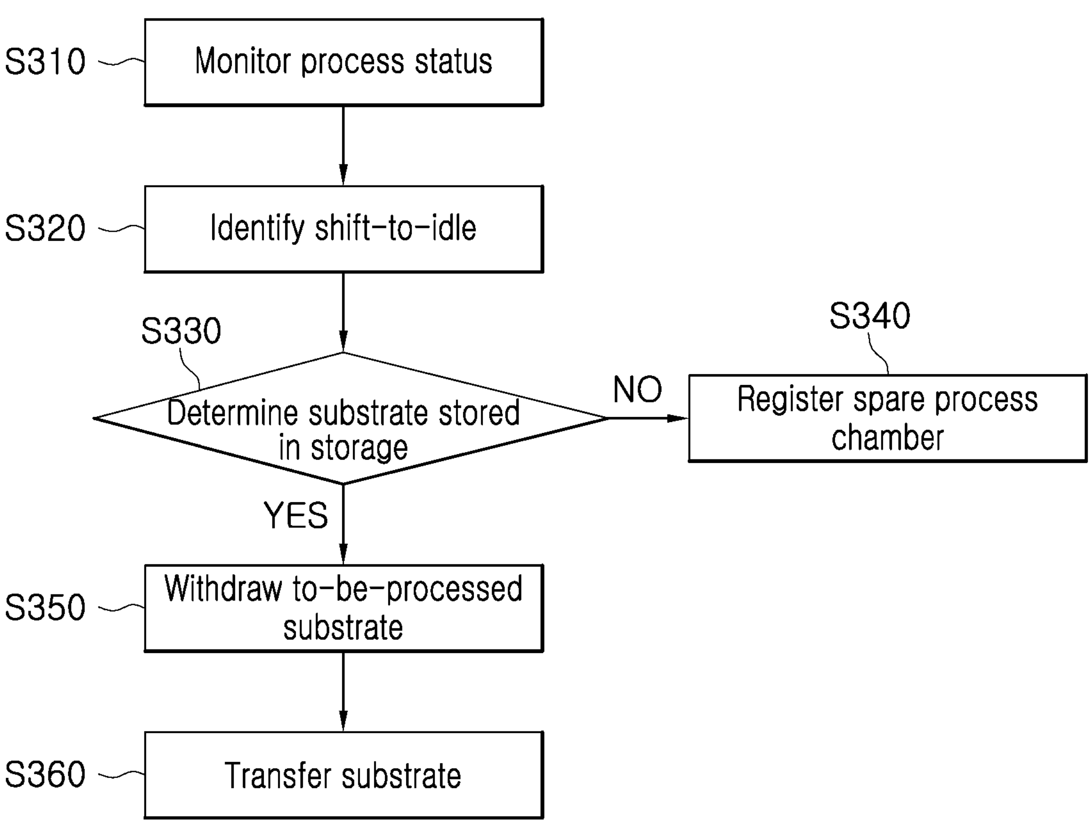
FIG. 9 is a flowchart illustrating an example of a process of withdrawing a substrate stored in a storage and transferring it to a process chamber in the process control method of the substrate processing apparatus according to the present disclosure.

Next, regarding the substrate supply process, FIG. 9 is a flowchart illustrating an example of a process of withdrawing a substrate stored in a storage and transferring it to a process chamber in the process control method of the substrate processing apparatus according to the present disclosure.

The control module 250 may determine (S310) the process status of each process chamber by monitoring the process status of a plurality of process chambers in real time. When the substrate supply plan for each process chamber is established, the control module 250 may determine the process status of the process chamber on the basis of the established substrate supply plan.

When a process chamber that is shifted to the idle state among the plurality of process chambers is identified (S320), the control module 250 may determine (S330) whether there is a to-be-processed substrate stored in the storage 210 in correspondence with the process chamber.

When there is no to-be-processed substrate stored in correspondence with the process chamber, the control module 250 may establish a substrate supply plan for the corresponding process chamber by registering (S340) the corresponding process chamber as a spare process chamber in the idle state.

When there is a to-be-processed substrate corresponding to the shift-to-idle process chamber, the control module 250 may identify the storage 210 corresponding to that shift-to-idle process chamber and withdraw (S350) the to-be-processed substrate stored in the storage 210 by controlling the transfer robot 141 of the transfer chamber 140 before transferring S360 it to the corresponding shift-to-idle process chamber.

Figure 10A:
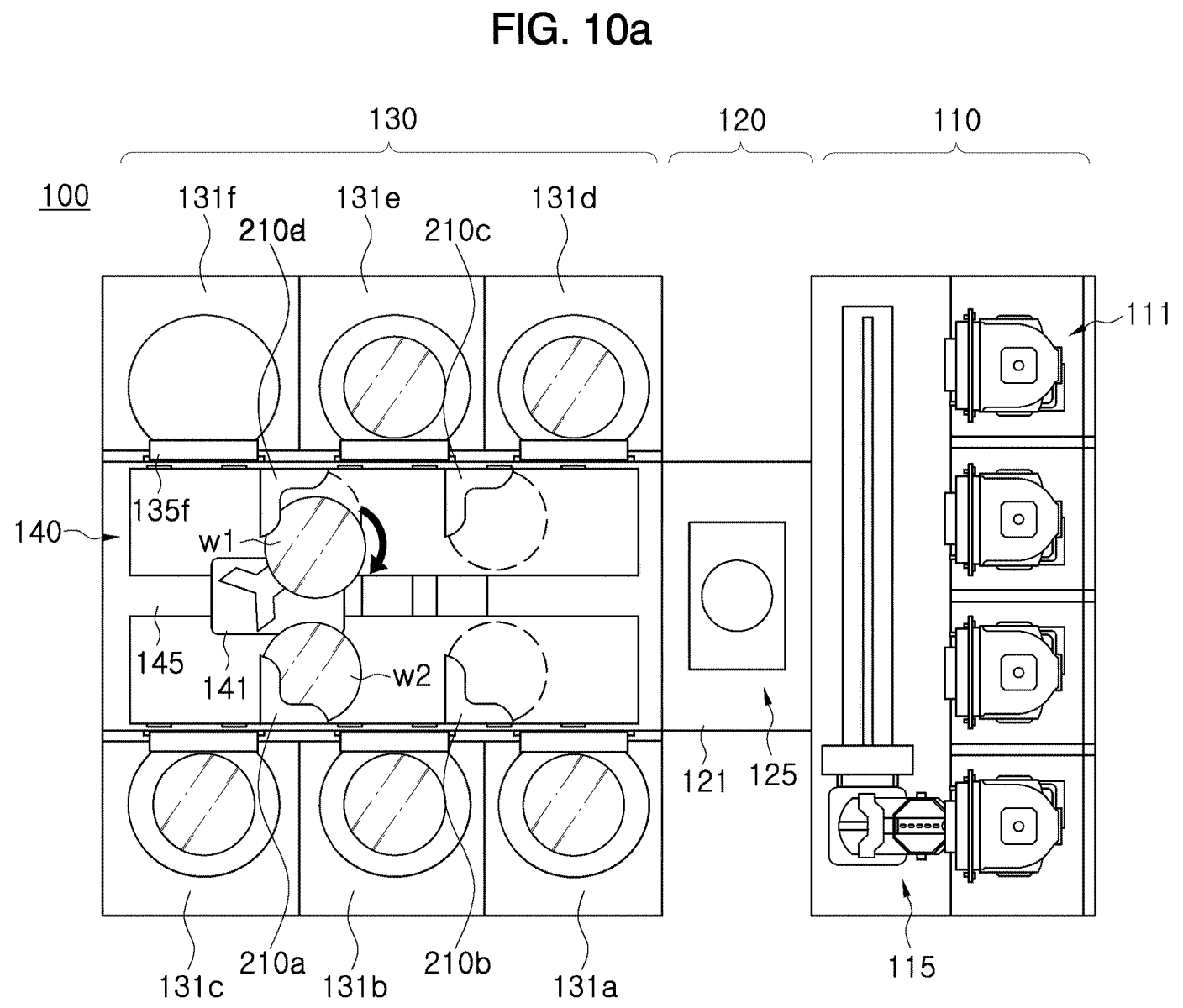
Figure 10B:
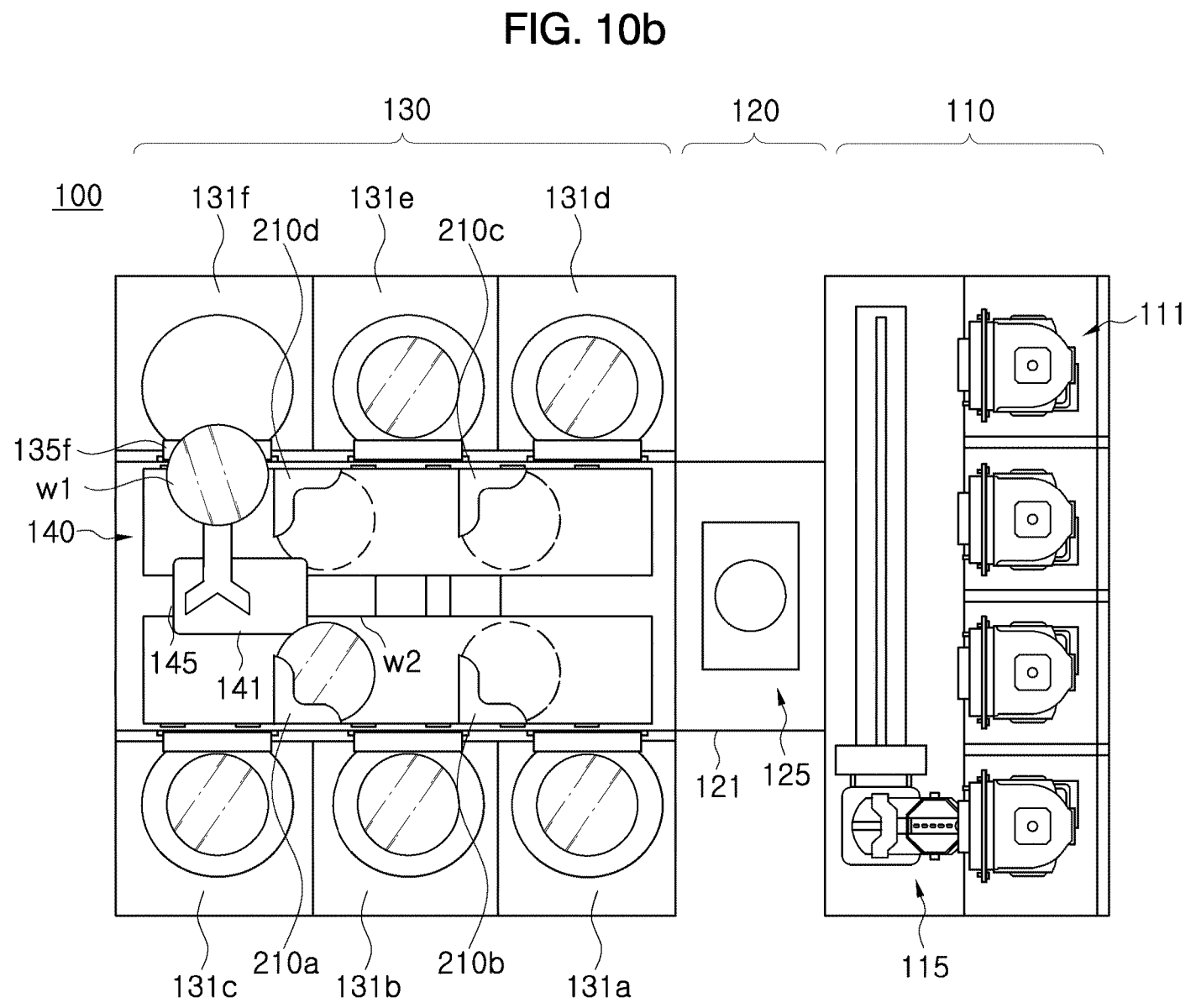

FIGS. 10A and 10B are views illustrating an example of withdrawing the substrates stored in the storages and transferring them to process chambers in the substrate processing apparatus according to the present disclosure.

As shown in FIG. 10A, with respect to the process chamber 131*f* shifted to the idle state among the plurality of process chambers 131*a* to 131*f*, it is determined whether the to-be-processed substrate is stored in the storage 210*d*, and the to-be-processed substrate w1 is taken out from the storage 210*d* by the transfer robot 141.

Then, as shown in FIG. 10B, the to-be-processed substrate w1 is transferred to the shift-to-idle process chamber 131*f* by the transfer robot 141.

As such, in the present disclosure, delay time due to substrate transfer can be significantly reduced since a to-be-processed substrate can be temporarily stored in a storage disposed near the process chamber in correspondence with a process chamber, and when the process chamber is shifted to the idle state, the to-be-processed substrate can be transferred to the corresponding process chamber immediately.

The above description is merely illustrative of the technical idea of the present disclosure, and various modifications and variations may be made by those skilled in the art to which the present disclosure pertains without departing from the essential characteristics of the present disclosure. Therefore, the embodiments described in the present disclosure are not intended to limit the technical spirit of the present disclosure, but to explain, and the technical spirit of the present disclosure is not limited by these embodiments. The protection scope of the present disclosure should be construed by the following claims, and all technical ideas within the scope equivalent thereto should be construed as being included in the scope of the present disclosure.

What is claimed is:

1. A substrate processing apparatus, comprising:

a plurality of process chambers configured to perform processing processes on a substrate;

a transfer chamber provided with a plurality of storages to temporarily store the substrate, and a transfer robot that transfers the substrate, wherein each of the plurality of storages is disposed on a side wall adjacent to a door of an associated process chamber at a position higher or lower than the door; and a control circuit configured to:

determine whether the plurality of process chambers has an idle chamber in which a process is not performed;

if the plurality of process chambers are determined not to have the idle chamber, determine a shift-to-idle time for each of the plurality of process chambers based on a remaining process time for each of the plurality of process chambers;

select a shift-to-idle process chamber to be shifted to an idle state first among the plurality of process chambers;

determine a storage associated with the shift-to-idle process chamber;

allocate a to-be-processed substrate to the determined storage; and control the transfer robot to transfer the to-be-processed substrate to the determined storage while the shift-to-idle process chamber is in a process state.

2. The substrate processing apparatus of claim 1, wherein each of the plurality of storages comprises:

an upper support and a lower support, ends of which are mounted on the side wall near the door of the associated process chamber of the plurality of process chambers, and configured to project outward from the side wall; and a substrate storage space provided between the upper support and the lower support, and in which at least a portion of the to-be-processed substrate is inserted and stored.

3. The substrate processing apparatus of claim 2, wherein each of the plurality of storages further comprises:

at least one intermediate support provided between the upper support and the lower support; and a plurality of substrate storage spaces partitioned by the at least one intermediate support.

4. The substrate processing apparatus of claim 1, wherein the control circuit comprises:

a transfer robot controller configured to control the transfer robot that transfers substrates to the plurality of process chambers and the plurality of storages.

5. The substrate processing apparatus of claim 4, wherein the control circuit is further configured to determine and manage a storage status of the to-be-processed substrate for the plurality of storages.

6. The substrate processing apparatus of claim 5, wherein the control circuit is further configured to establish a substrate supply plan for each of the plurality of process chambers on the basis of a process status for each of the plurality of process chambers and the storage status of the to-be-processed substrate stored in the determined storage.

7. The substrate processing apparatus of claim 1, wherein the control circuit is configured further to:

compute the shift-to-idle time based on a recipe of each of the plurality of process chambers stored in the control circuit.

* * * * *